United States Patent
Montena

(10) Patent No.: US 10,424,893 B2
(45) Date of Patent: Sep. 24, 2019

(54) OUTER SLEEVE FOR CATV FILTER

(71) Applicant: PPC Broadband, Inc., East Syracuse, NY (US)

(72) Inventor: Noah Montena, Latham, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 267 days.

(21) Appl. No.: 15/340,452

(22) Filed: Nov. 1, 2016

(65) Prior Publication Data

US 2017/0047701 A1  Feb. 16, 2017

Related U.S. Application Data

(63) Continuation of application No. 14/013,797, filed on Aug. 29, 2013, now Pat. No. 9,516,774, which is a
(Continued)

(51) Int. Cl.
| | |
|---|---|
| *B23P 19/00* | (2006.01) |
| *H01R 43/20* | (2006.01) |
| *H01R 43/26* | (2006.01) |
| *H01R 24/42* | (2011.01) |
| *H05K 5/04* | (2006.01) |

(Continued)

(52) U.S. Cl.
CPC .............. *H01R 43/26* (2013.01); *H01R 24/42* (2013.01); *H05K 5/04* (2013.01); *H01R 2103/00* (2013.01); *H04N 7/102* (2013.01)

(58) Field of Classification Search
CPC .... H01R 43/26; H01R 24/42; H01R 2103/00; H04N 7/102; H05K 5/04
USPC ............... 439/578, 63, 620.01, 620.03, 76.1; 333/167; 210/446
See application file for complete search history.

(56) References Cited

U.S. PATENT DOCUMENTS

| | | | |
|---|---|---|---|
| 2,777,998 A | 1/1957 | Shepard | |
| 4,291,936 A * | 9/1981 | Oldfield | ................. H01R 24/40 29/758 |

(Continued)

FOREIGN PATENT DOCUMENTS

| | | |
|---|---|---|
| WO | 2004/045072 A1 | 5/2004 |
| WO | 2005/029665 A2 | 3/2005 |

(Continued)

*Primary Examiner* — Paul D Kim
(74) *Attorney, Agent, or Firm* — MH2 Technology Law Group LLP

(57) ABSTRACT

An outer sleeve for a CATV filter has, in one embodiment, a first end and a second end. The second end has a face with one or more engagement holes. A torque transmitter for installing a cable television (CATV) filter on an interface port includes a CATV filter header configured to support a CATV filter component. The torque transmitter also includes a torque transmitting housing configured to at least partially house the CATV filter header. The torque transmitting housing is configured to fit a CATV filter installation tool, receive a torque force from the CATV filter installation tool when the torque transmitting housing is fit to the CATV filter installation tool, and transmit the torque force received from the CATV filter installation tool to the CATV filter header so as to allow the CATV filter installation tool to install the torque transmitting housing and the CATV filter on the interface port.

17 Claims, 3 Drawing Sheets

Related U.S. Application Data continuation of application No. 11/467,247, filed on Aug. 25, 2006, now Pat. No. 8,545,235.

(51) Int. Cl.
  *H01R 103/00* (2006.01)
  *H04N 7/10* (2006.01)

(56) References Cited

U.S. PATENT DOCUMENTS

| | | |
|---|---|---|
| 4,701,726 A | 10/1987 | Holdsworth |
| 4,773,880 A | 9/1988 | Sutton et al. |
| 5,150,087 A | 9/1992 | Yoshie et al. |
| 5,432,488 A | 7/1995 | Kotani et al. |
| 5,662,494 A * | 9/1997 | Zennamo, Jr. ........ H01R 13/521 439/589 |
| 6,273,766 B1 | 8/2001 | Zennamo, Jr. et al. |
| 6,636,129 B2 | 10/2003 | Zennamo, Jr. et al. |
| 6,683,773 B2 | 1/2004 | Montena |
| 6,737,925 B1 | 5/2004 | Logue et al. |
| 6,737,935 B1 | 5/2004 | Shafer |
| 6,784,760 B2 | 8/2004 | Olcen et al. |
| 6,794,957 B2 | 9/2004 | Shafer et al. |
| 6,829,813 B2 * | 12/2004 | Zennamo ............... H01R 24/42 29/521 |
| 6,888,423 B2 | 5/2005 | Tresness et al. |
| 6,986,666 B2 | 1/2006 | Benson et al. |
| 7,023,298 B1 | 4/2006 | Palinkas et al. |
| 7,303,439 B1 | 12/2007 | Montena |
| 8,545,235 B2 | 10/2013 | Montena |
| 2002/0064014 A1 | 5/2002 | Montena |
| 2004/0057186 A1 | 3/2004 | Chawgo |
| 2004/0085156 A1 | 5/2004 | Olcen et al. |
| 2004/0104786 A1 | 6/2004 | Shafer et al. |
| 2005/0086701 A1 | 4/2005 | Palinkas et al. |
| 2005/0164525 A1 | 7/2005 | Benson et al. |
| 2005/0282433 A1 | 12/2005 | Pixley et al. |

FOREIGN PATENT DOCUMENTS

| | | |
|---|---|---|
| WO | 2005/041553 A2 | 5/2005 |
| WO | 2005/041553 A3 | 5/2005 |

* cited by examiner

OUTER SLEEVE FOR CATV FILTER

PRIORITY CLAIM

This application is a continuation of, and claims the benefit and priority of, U.S. patent application Ser. No. 14/013,797, (now U.S. Pat. No. 9,516,774) filed on Aug. 29, 2013, priority of, U.S. patent application Ser. No. 14/013, 797, filed on Aug. 29, 2013, which is a continuation of U.S. patent application Ser. No. 11/467,247, filed on Aug. 25, 2006 (now U.S. Pat. No. 8,545,235). The entire contents of such applications are hereby incorporated by reference.

FIELD OF THE INVENTION

This invention relates generally to the field of CATV filters, and more particularly to a torque transmitting outer sleeve for a CATV filter.

BACKGROUND

In typical CATV applications, a filter circuit or network is provided to pass signals having frequencies within one or more specified bandwidths, sometimes with a desired amount of signal attenuation, while blocking signals of other frequencies. It is convenient, but not necessary, to mount the electrical components such as capacitors, inductors, and resistors on one or more printed circuit boards in essentially conventional fashion. The circuit board carrying the filter circuit components is mounted within a suitable protective housing. Physical rigidity is required to maintain stable electrical response. Connection headers at each end provide for connecting the filter to a coaxial cable connector and to an equipment port. The entire assembly is commonly referred to as a filter or trap.

It is customary in the CATV industry for system technicians to use special wrenches for the installation and removal of traps. These special wrenches are of the pin spanner type where the driving pins of the wrench are accepted by two shallow holes bored into the end face of one header, sometimes referred to as engagement holes. This has been effective, but requires a degree of manufacturing difficulty and material usage which increases the cost of the trap housing components.

U.S. Pat. No. 5,150,087 (Yoshie et al.); U.S. Pat. No. 5,432,488 (Kotani et al.); U.S. Pat. No. 5,662,494 (Zennamo, Jr. et al.); U.S. Pat. No. 6,273,766 (Zennamo, Jr. et al.); U.S. Pat. No. 6,636,129 (Zennamo, Jr. et al.); U.S. Pat. No. 6,829,813 (Zennamo, Jr. et al.); and U.S. Pat. No. 6,888,423 (Tresness et al.) all show traps with the two engagement holes drilled into the end face of one of the headers.

SUMMARY

Briefly stated, a housing for a CATV filter includes an outer sleeve which can be made of stainless steel. A filter assembly and two headers are contained within the outer sleeve. Two engagement holes for a special pin spanner-type wrench are formed in a face of the outer sleeve instead of in a header. The engagement holes are preferably "drifted" holes, which in effect means that rims are created during the forming of holes which add to the strength of the holes.

According to an embodiment, an outer sleeve for a CATV filter has a first and second end. The second end includes a face that defines a connector hole. The connector hole is configured to receive a cable connector and the connector hole is located on a first axis. The face also defines at least one engagement hole located on a different axis.

According to another embodiment, a method for making an outer sleeve for a CATV filter includes forming a first hole located on a first axis in a face. The face is located on an end of the outer sleeve and the first hole is configured to receive a cable connector. The method also includes forming at least one engagement hole in the face. The at least one engagement hole located on a different axis.

DETAILED DESCRIPTION OF THE PREFERRED EMBODIMENT

Figure 1:
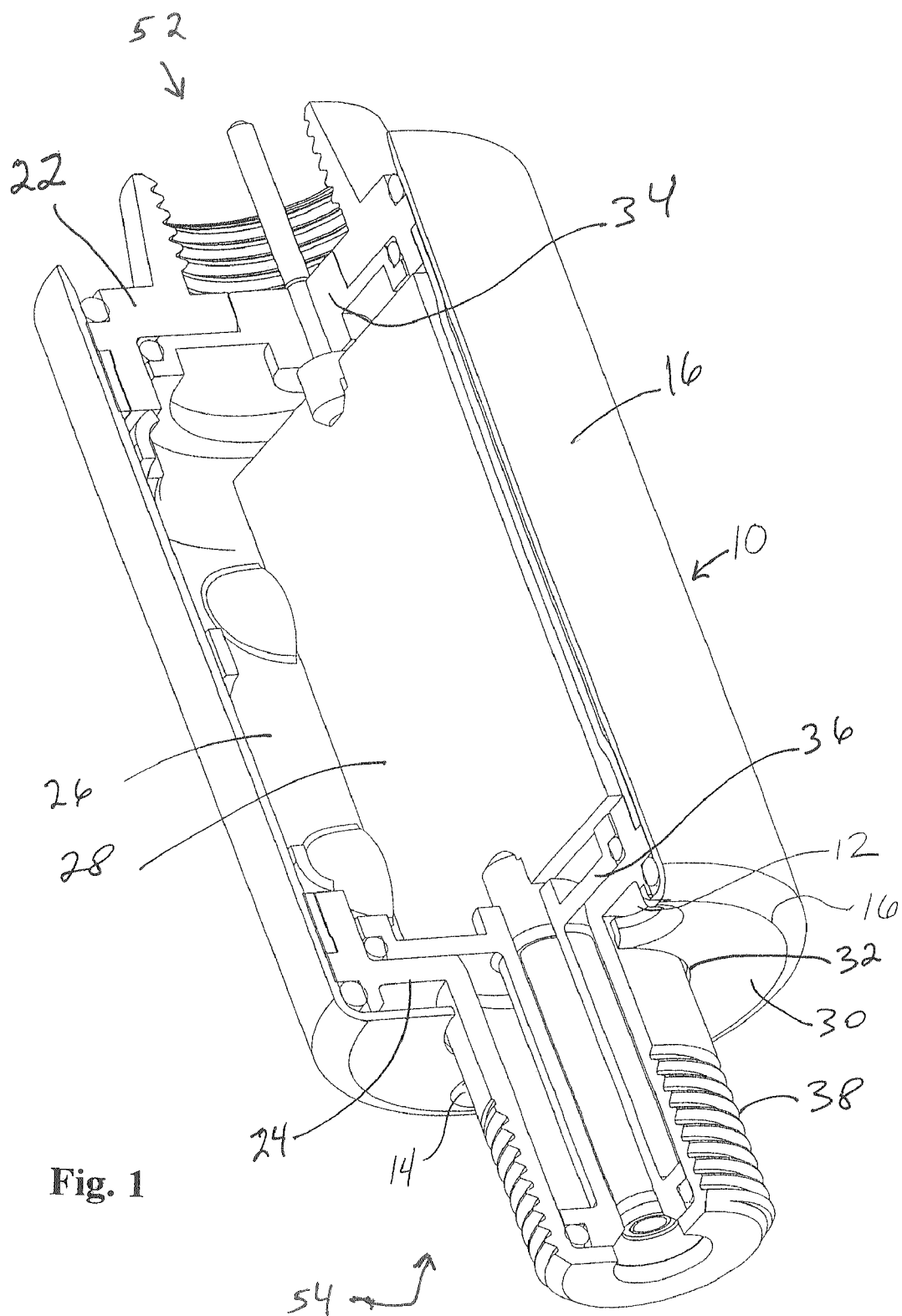
FIG. 1 shows a cutaway perspective view of a filter with a housing according to an embodiment of the present invention.
Figure 2:
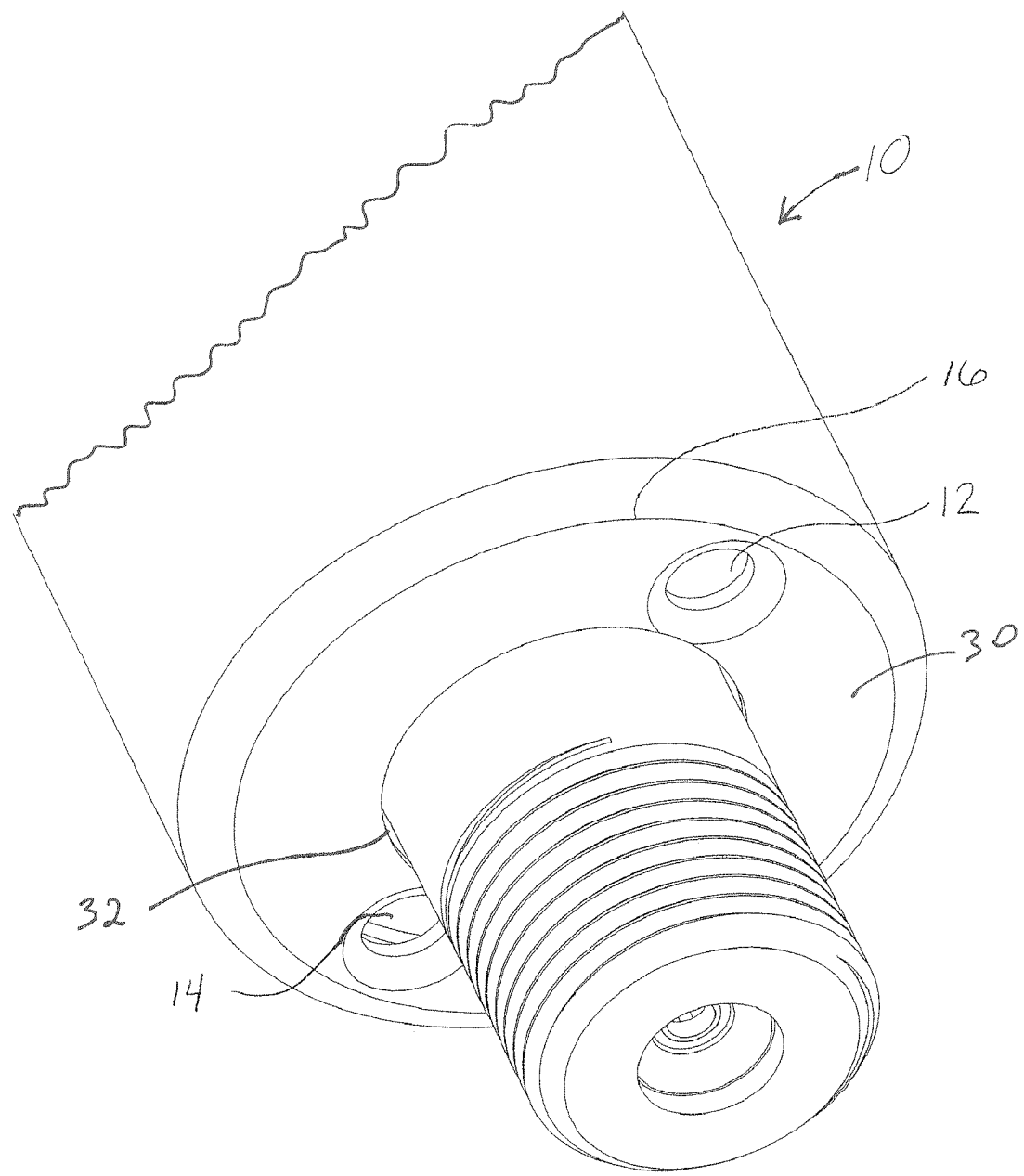
FIG. 2 shows a perspective view of the housing of the embodiment of FIG. 1 with two engagement holes shown.
Figure 3:
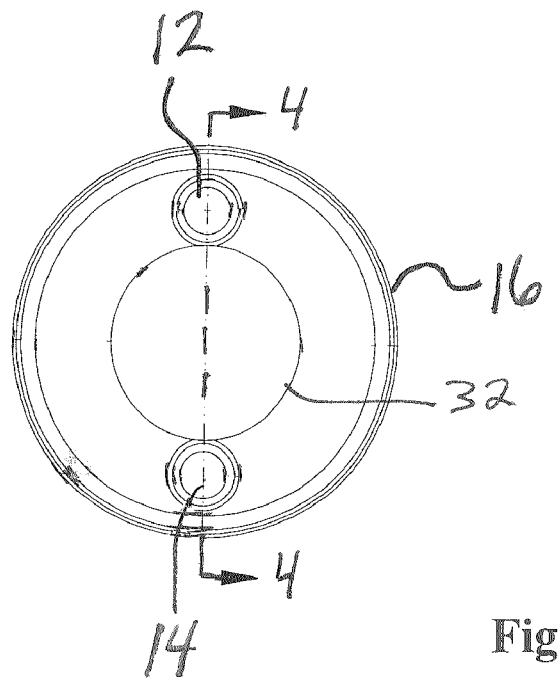
FIG. 3 shows a front elevation view of the embodiment of FIG. 1.
Figure 4:
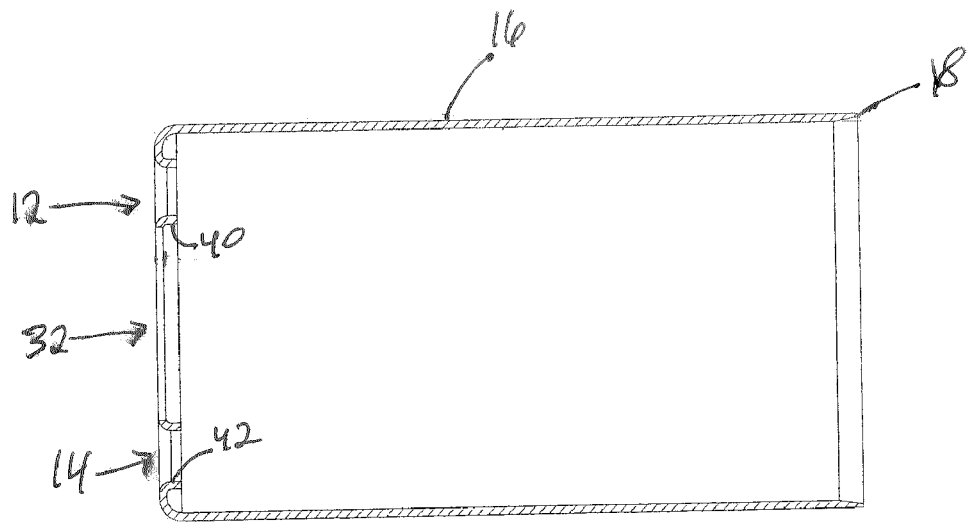
FIG. 4 shows a cross-sectional view taken across line 4-4 of FIG. 3.

Referring to FIGS. 1-4, a CATV filter 10 includes a circuit board 28 connected to an inner frame 26. At one end 52 of filter 10, an insulator 34 is adjacent to one end of circuit board 28 and is held in place partly by a header 22, while at another end 54 of filter 10, an insulator 36 is adjacent to another end of circuit board 28 and is held in place partly by a header 24. An outer sleeve, also known as a housing, 16 fits over inner frame 26 and headers 22, 24 holding the assembly together. A portion of header 22 is shaped to connect to an equipment port (not shown), while a portion of header 24 is shaped to connect to a coaxial cable (not shown) via a coaxial cable connector (not shown), and in particular, includes a threaded connector 38.

Outer sleeve 16 includes a central hole 32 in a face 30 to accommodate threaded connector 38. Outer sleeve 16 also includes two engagement holes 12, 14 to accommodate the driving pins (not shown) of the special pin spanner-type wrench (not shown) which is used in the industry to screw filters and traps onto equipment ports. Outer sleeve 16 is preferably of stainless steel, which is comparable to brass in terms of durability. When fabricating outer sleeve 16 of stainless steel, the part is deep drawn, which means that it starts out as steel sheet and is successively stamped into ever deeper and narrower "soup cans" until the final diameter and length are reached. The bottom end is closed, while the top end is still attached all the way around the rim to the parent sheet.

Engagement holes 12, 14 are then formed in face 30 by punching two small holes in the bottom of the partially formed outer sleeve, after which a larger diameter tapered pin is forced through the holes, pushing the edge inward and stretching the diameter of each engagement hole 12, 14 to its final diameter. Central hole 32 is then punched out, after which the part is sheared off the parent sheet and the edge is compacted in an operation known as a "pinch trim" which tapers edge 18 while eliminating the sharp edge left from the shearing. The taper of edge 18 is preferably approximately 15 degrees to aid in fitting outer sleeve 16 over inner frame 26 and headers 22, 24.

Engagement holes 12, 14 are "drifted" holes, meaning that they have curled-in edges 40, 42, respectively, as a result of how they were made. Simply die-punching engagement holes 12, 14 would not add curled edges 40, 42 to engagement holes 12, 14. The strength of the "drifted" edge of the holes, combined with the durability of the stainless steel base metal, makes engagement holes 12, 14 comparable in performance to drilled holes in brass. Curled edges 40, 42 add effective thickness to engagement holes 12, 14 which is greater than the thickness of the sheet metal itself, thus providing structural rigidity to withstand the up to 90 in-lb of torque expected when abused, with minimal deformation of engagement holes 12, 14. Non-drifted holes actually tear under those conditions, whereas the drifted holes merely become slightly egg-shaped. In addition, the prior art method of drilling engagement holes in one header is costlier than the present method of forming engagement holes 12, 14 in outer sleeve 16.

With no engagement holes in the header, machining or casting or metal injection molding without secondary machining operations becomes possible. The material thickness of the header may also be reduced, also saving costs.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

The following is claimed:

1. A torque transmitter for installing a cable television (CATV) filter on an interface port comprising:
   a CATV filter header configured to support a CATV filter component;
   a torque transmitting housing configured to at least partially house the CATV filter header;
   wherein the torque transmitting housing is configured to fit a CATV filter installation tool, receive a torque force from the CATV filter installation tool when the torque transmitting housing is fit to the CATV filter installation tool, and transmit the torque force received from the CATV filter installation tool to the CATV filter header so as to allow the CATV filter installation tool to install the torque transmitting housing and the CATV filter on the interface port;
   wherein the torque transmitting housing comprises a first receiving portion configured to fit a first torque transmitting portion of the CATV filter installation tool and a second receiving portion configured to fit a second torque transmitting portion of the CATV filter installation tool;
   wherein the first receiving portion of the torque transmitting housing comprises a first open portion, the first torque transmitting portion of the CATV filter installation tool comprises a first protrusion portion configured to fit the first open portion so as to transmit torque from the first protrusion portion to the first open portion, the second receiving portion of the torque transmitting housing comprises a second open portion, and the second torque transmitting portion of the CATV filter installation tool comprises a second protrusion portion configured to fit the second open portion so as to transmit torque from the second protrusion portion to the second open portion;
   wherein the torque transmitting housing comprises an end face portion facing away from the interface port, and the first and second receiving portions of the torque transmitting housing are positioned on the end face portion of the torque transmitting housing; and
   wherein the first receiving portion of the torque transmitting housing comprises a first curled portion configured to engage the first torque transmitting portion of the CATV filter installation tool, and the second receiving portion of the torque transmitting housing comprises a second curled portion configured to engage the second torque transmitting portion of the CATV filter installation tool.

2. The torque transmitter of claim 1, wherein the first and second curled portions each comprise curled-in edges that define drifted holes.

3. The torque transmitter of claim 1, wherein the first and second curled portions each comprise a substantially annular extension that extends inward from the end face portion in a direction that is substantially parallel to a central longitudinal axis of the torque transmitting housing.

4. The torque transmitter of claim 3, wherein the annular extensions are circumferentially from one another with respect to the central longitudinal axis of the torque transmitting housing.

5. A torque transmitter for installing a cable television (CATV) filter on an interface port comprising:
   a CATV filter header configured to support a CATV filter component;
   a torque transmitting housing configured to at least partially house the CATV filter header wherein the torque transmitting housing comprises:
      a first receiving portion comprising a first curled portion that is configured to fit a first torque transmitting portion of a CATV filter installation tool; and
      a second receiving portion comprising a second curled portion that is configured to fit a second torque transmitting portion of the CATV filter installation tool;
   wherein the torque transmitting housing is configured to fit a CATV filter installation tool, receive a torque force from the CATV filter installation tool when the torque transmitting housing is fit to the CATV filter installation tool, and transmit the torque force received from the CATV filter installation tool to the CATV filter header so as to allow the CATV filter installation tool to install the torque transmitting housing and the CATV filter on the interface port;
   and
   wherein the torque transmitting housing comprises an end face portion facing away from the interface port, and the first and second receiving portions of the torque transmitting housing are positioned on the end face portion of the torque transmitting housing.

6. The torque transmitter of claim 5, wherein the first receiving portion of the torque transmitting housing comprises a first open portion, the first torque transmitting portion of the CATV filter installation tool comprises a first protrusion portion configured to fit the first open portion so as to transmit torque from the first protrusion portion to the first open portion, the second receiving portion of the torque transmitting housing comprises a second open portion, and the second torque transmitting portion of the CATV filter installation tool comprises a second protrusion portion configured to fit the second open portion so as to transmit torque from the second protrusion portion to the second open portion.

7. A torque transmitter for installing a filter on an interface port comprising:
   a filter header configured to support a filter component;

a torque transmitting housing configured to at least partially house the filter header wherein the torque transmitting housing comprises:
  a first receiving portion comprising a first curled portion that is configured to fit a first torque transmitting portion of an installation tool; and
  a second receiving portion comprising a second curled portion that is configured to fit a second torque transmitting portion of the installation tool;
wherein the torque transmitting housing is configured to receive a torque force from the installation tool when the torque transmitting housing is fit to the installation tool, and transmit the torque force received from the installation tool to the filter header so as to install the torque transmitting housing, the filter header, and the filter component on the interface port.

8. The torque transmitter of claim 7, wherein the torque transmitting housing comprises an end face portion facing away from the interface port, and the first and second receiving portions of the torque transmitting housing are positioned on the end face portion of the torque transmitting housing.

9. The torque transmitter of claim 7, wherein the first receiving portion of the torque transmitting housing comprises a first open portion, the first torque transmitting portion of the installation tool comprises a first protrusion portion configured to fit the first open portion so as to transmit torque from the first protrusion portion to the first open portion, the second receiving portion of the torque transmitting housing comprises a second open portion, and the second torque transmitting portion of the installation tool comprises a second protrusion portion configured to fit the second open portion so as to transmit torque from the second protrusion portion to the second open portion.

10. A torque transmitter for installing a filter on an interface port comprising:
  a filter header configured to support a filter component; and
  a torque transmitting outer sleeve configured to at least partially enclose the filter header wherein the torque transmitting outer sleeve comprises:
    a first receiving portion comprising a first curled portion that is configured to fit a first torque transmitting portion of an installation tool; and
    a second receiving portion comprising a second curled portion that is configured to fit a second torque transmitting portion of the installation tool;
  wherein the torque transmitting outer sleeve is configured to receive a torque force from the installation tool when the torque transmitting outer sleeve is fit to the installation tool, and transmit the torque force received from the installation tool to the filter header so as to install the torque transmitting outer sleeve, the filter header, and the filter component on the interface port.

11. The torque transmitter of claim 10, wherein the torque transmitting outer sleeve comprises an end face portion facing away from the interface port, and the first and second receiving portions of the torque transmitting outer sleeve are positioned on the end face portion of the torque transmitting outer sleeve.

12. The torque transmitter of claim 11, wherein the torque transmitting outer sleeve comprises an end portion positioned at an opposing axial end of the torque transmitting outer sleeve from the end face portion, wherein the end portion comprises an open portion, and wherein an inner diameter of the torque transmitting outer sleeve increases proceeding toward the end portion.

13. The torque transmitter of claim 11, wherein the torque transmitting outer sleeve comprises an end portion positioned at an opposing axial end of the torque transmitting outer sleeve from the end face portion, wherein the end portion comprises an open portion, and wherein an inner diameter of the open portion is substantially equal to a diameter of a remainder of the torque transmitting outer sleeve.

14. The torque transmitter of claim 10, wherein the first receiving portion of the torque transmitting outer sleeve comprises a first open portion, the first torque transmitting portion of the installation tool comprises a first protrusion portion configured to fit the first open portion so as to transmit torque from the first protrusion portion to the first open portion, the second receiving portion of the torque transmitting outer sleeve comprises a second open portion, and the second torque transmitting portion of the installation tool comprises a second protrusion portion configured to fit the second open portion so as to transmit torque from the second protrusion portion to the second open portion.

15. The torque transmitter of claim 14, wherein the first open portion and the second open portion are parallel to one another.

16. The torque transmitter of claim 14, wherein a central longitudinal axis through the filter header is aligned with a central longitudinal axis through the torque transmitting outer sleeve, and wherein a central longitudinal axis through the first open portion is radially-offset from the central longitudinal axis through the torque transmitting outer sleeve.

17. The torque transmitter of claim 16, wherein the central longitudinal axis through the filter header is positioned between the central longitudinal axis through the first open portion and a central longitudinal axis through the second open portion.

* * * * *

UNITED STATES PATENT AND TRADEMARK OFFICE
CERTIFICATE OF CORRECTION

PATENT NO. : 10,424,893 B2
APPLICATION NO. : 15/340452
DATED : September 24, 2019
INVENTOR(S) : Noah Montena It is certified that error appears in the above-identified patent and that said Letters Patent is hereby corrected as shown below:

On the Title Page

Item (57), ABSTRACT, "An outer sleeve for a CATV filter has, in one embodiment, a first end and a second end. The second end has a face with one or more engagement holes. A torque transmitter for", should read – A torque transmitter for –

In the Claims

Column 4, Claim 5, Line 38, "fit a CATV filter installation tool, receive a torque force", should read – receive a torque force –

Signed and Sealed this
Twenty-sixth Day of November, 2019

Andrei Iancu
*Director of the United States Patent and Trademark Office*